United States Patent
Tomita et al.

[19]

[11] Patent Number: 5,854,554
[45] Date of Patent: Dec. 29, 1998

[54] METHOD AND APPARATUS FOR TESTING A MAGNETIC HEAD DURING MANUFACTURE UTILIZING AN INTERNAL MAGNETIC FIELD

[75] Inventors: Katsuhiko Tomita, Narashino; Nozomu Hachisuka; Toshiaki Maeda, both of Saku, all of Japan

[73] Assignee: TDK Corporation, Tokyo, Japan

[21] Appl. No.: 733,282

[22] Filed: Oct. 17, 1996

[30] Foreign Application Priority Data

Oct. 26, 1995 [JP] Japan ................................. 7-300465

[51] Int. Cl.⁶ .................................................. G01R 33/12
[52] U.S. Cl. .......................... 324/210; 324/263; 324/212
[58] Field of Search .................................. 324/210, 212, 324/263, 207.21, 252, 228; 338/32 R; 360/113

[56] References Cited

U.S. PATENT DOCUMENTS 3,706,926  12/1972  Barrager et al. ....................... 324/210
5,668,477   9/1997  Mahmoudian et al. ................ 324/212
5,696,445  12/1997  Inbar ..................................... 324/210

FOREIGN PATENT DOCUMENTS

56-19458    2/1981  Japan ..................................... 324/212
58-194124  11/1983  Japan ..................................... 324/210
61-80076    4/1986  Japan ..................................... 324/210
6-150264    5/1994  Japan .

Primary Examiner—Jay M. Patidar
Attorney, Agent, or Firm—Collard & Roe, P.C.

[57] ABSTRACT

A method and apparatus for testing a magnetic head provided with at least one MR transducer. The method includes a step of applying a sense current varying with respect to time to the MR transducer element via input/output terminals of the MR transducer element, and a step of measuring a terminal voltage across the input/output terminals of the MR transducer element to check varying resistance characteristics of the MR transducer element with respect to the variation of the applied sense current.

16 Claims, 6 Drawing Sheets

METHOD AND APPARATUS FOR TESTING A MAGNETIC HEAD DURING MANUFACTURE UTILIZING AN INTERNAL MAGNETIC FIELD

FIELD OF THE INVENTION

The present invention relates to a method and apparatus for testing a magnetic head provided with at least one magnetoresistive (MR) transducer element.

DESCRIPTION OF THE RELATED ART

Recently, a magnetic head provided with a MR transducer element has been developed as a thin film magnetic head used for reading out information from a magnetic medium such as a magnetic disk.

Since the magnetic head with the MR transducer element operates to detect its inner resistance variations due to the magnetic field variation applied thereto from the external magnetic medium, it is important to test reproducibility of the inner resistance of the MR transducer element after manufacturing.

As the MR transducer element utilizes the MR effect occurring in a thin film layer made of ferromagnetic material such as permalloy, a high reading output can be provide irrespective of relative speed between the head and the magnetic medium. However, by using the ferromagnetic material, there is a possibility that a defective MR transducer element accompanying with Barkhausen noise may be manufactured.

As is known, Barkhausen noise is produced due to structural defects in the magnetic material, whereby its magnetic wall is disturbed from free moving. Thus, it cannot be expected for a magnetic head with such defective MR element to perform normal reproduction operation over its all operating regions. Therefore, it is necessary to confirm at each test after manufacturing that a finished magnetic head with a MR transducer element is a good article and will not produce any inherent noise such as Barkhausen noise.

The conventional method for testing whether Barkhausen noise is produced or not from a MR head consists of a process of attaching the finished MR head assembly to a suspension, a process of practically operating the MR head above the rotating magnetic disk with flowing a constant sense current, a process of measuring output voltage wave shape from the MR head, and a process of judging from the measured wave shape whether Barkhausen noise is produced or not.

Japanese Patent Unexamined Publication No.6(1994)-150264 possessed by the same assignee of the present invention discloses an improved MR head testing method. In this testing method, an external alternating magnetic field is applied, in a direction perpendicular to an Air Bearing Surface (ABS), to a plurality of MR heads which are aligned on a head block and are not yet individually separated, and electromagnetic transfer characteristics of each of the MR heads with respect to the varying external magnetic field is measured.

However, according to the above-mentioned conventional testing methods, since the magnetic field is externally applied to the MR element, it is difficult to clearly judge whether a possible distortion in the detected output voltage wave shape is caused by lack of stability or reproducibility of the magnetic field externally applied to the MR element or by noise or distortion produced from the MR element itself. Thus, correct evaluation and test for the reproducibility of the MR transducer element cannot be expected.

SUMMARY OF THE INVENTION

It is therefore an object of the present invention to provide a method and apparatus for testing a magnetic head provided with at least one MR transducer, whereby a correct reproducibility evaluation of the MR transducer element can be attained by suppressing, as much as possible, external influence applied to the MR transducer element.

The present invention relates to a method and apparatus for testing a magnetic head provided with at least one MR transducer element. According to the present invention, particularly, the method includes a step of applying a sense current varying with respect to time to the MR transducer element via input/output terminals of the MR transducer element, and a step of measuring a terminal voltage across the input/output terminals of the MR transducer element to check varying resistance characteristics of the MR transducer element with respect to the variation of the applied sense current.

In the conventional methods, the sense current applied to the MR transducer element has been kept constant. However, according to the present invention, varying sense current is applied to the MR transducer element. Namely, the magnetic field applied to the MR transducer element is varied by continuously varying the sense current flowing through the MR transducer element, and then the varying voltage across the terminals of the MR transducer element based upon the resistance changes due to the applied varying sense current is detected whether a noise component is involved in the detected terminal voltage. Since the resistance variation characteristics of the MR transducer element is tested under the magnetic field produced by the varying sense current flowing through the MR transducer itself, any influence externally applied thereto can be almost eliminated resulting that reproducibility of the MR transducer element can be correctly evaluated.

According to the present invention, also, a method includes a step of applying a sense current varying with respect to time to the MR transducer element via input/output terminals of the MR transducer element. This MR transducer element is one of MR transducer elements of magnetic heads which are aligned on a head block and are not yet individually separated from the head block. The method also includes a step of measuring a terminal voltage across the input/output terminals of the MR transducer element to check varying resistance characteristics of the MR transducer element with respect to the variation of the applied sense current.

It is preferred that the sense current applying step includes a step of applying a continuously varying sense current to the MR transducer element via the input/output terminals, and that the measuring step includes a step of extracting a high frequency component of the measured terminal voltage.

It is also preferred that the sense current applying step includes a step of applying a continuously varying sense current to the MR transducer element, and that the measuring step includes a step of extracting only a component of the measured terminal voltage by means of a bridge circuit, the component corresponding to the varying resistance of the MR transducer element due to the applied varying sense current.

Preferably, the sense current applying step includes a step of applying a continuously and periodically varying sense current to the MR transducer element via the input/output terminals.

Furthermore, according-to the present invention, an apparatus for testing a magnetic head provided with at least one MR transducer element and input/output terminals of the MR transducer element is provided. This apparatus includes a probe unit for electrically contacting to the input/output terminals of the MR transducer element, a current generation unit for providing a sense current varying with respect to time, a unit for applying the provided varying sense current to the MR transducer element via the probe unit, and a unit for measuring a terminal voltage across the input/output terminals of the MR transducer element via the probe unit to check varying resistance characteristics of the MR transducer element with respect to the variation of the applied sense current.

Also, according to the present invention, the apparatus includes a probe unit for electrically contacting to the input/output terminals of the MR transducer element of each of magnetic heads which are aligned on a head block and are not yet individually separated from the head block, a current generation unit for providing a sense current varying with respect to time, a unit for applying the provided varying sense current to the MR transducer element via the probe unit, and a unit for measuring a terminal voltage across the input/output terminals of the MR transducer element via the probe unit to check varying resistance characteristics of the MR transducer element with respect to the variation of the applied sense current.

It is preferred that the current generation unit includes unit for providing a continuously varying sense current with respect to time, and that the measuring unit includes unit for extracting a high frequency component of the measured terminal voltage across the input/output terminals. The extracting unit may be a high pass frequency filter.

It is also preferred that the current generation unit includes unit for providing a continuously varying sense current with respect to time, and that the measuring unit includes unit for extracting only a component of the measured terminal voltage. The component corresponds to the varying resistance of the MR transducer element due to the applied varying sense current. The extracting unit may include a bridge circuit with four arms. The input/output terminals of the MR transducer element are connected to the bridge circuit as one of the arms via the probe unit so that only a component corresponding to the varying resistance of the MR transducer element due to the applied varying sense current is extracted.

Preferably, the current generation unit includes unit for providing a continuously and periodically varying sense current.

Further objects and advantages of the present invention will be apparent from the following description of the preferred embodiments of the invention as illustrated in the accompanying drawings.

DESCRIPTION OF THE PREFERRED EMBODIMENTS

Figure 1:
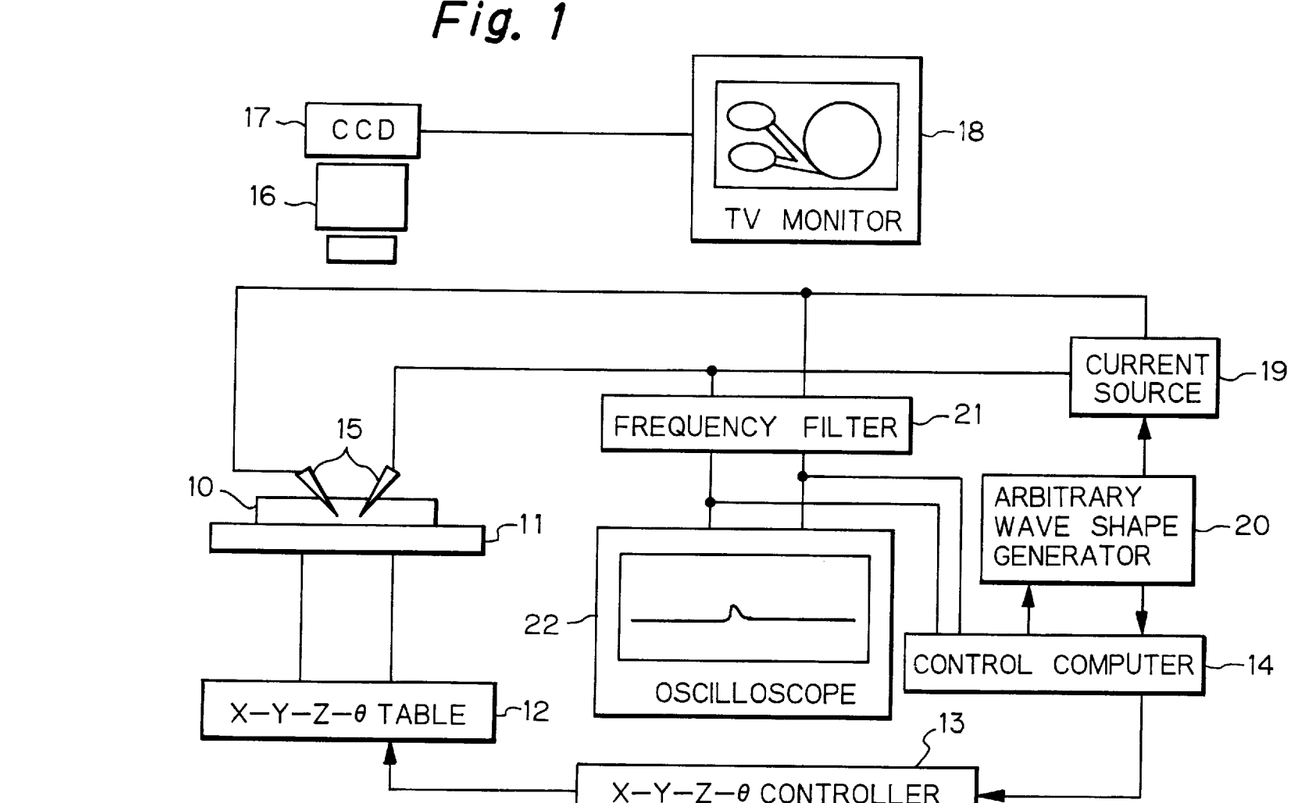
FIG. 1 is a block diagram schematically showing a circuit structure of a preferred embodiment of an apparatus for testing a magnetic head with at least one MR transducer element, according to the present invention.

In FIG. 1 which schematically shows a circuit structure of a preferred embodiment of an apparatus for testing a magnetic head with at least one thin film MR read element, reference numeral 10 denotes a head block with a plurality magnetic heads which have respective MR transducer elements to be tested, and 11 denotes a platform of a X-Y-Z-θ table 12. The head block 10 is temporally fixed on the platform 11. The X-Y-Z-θ table 12 for moving the platform 11 is electrically connected via a X-Y-Z-θ controller 13 to a control computer 14.

The head block 10 is an article in the manufacturing process of the magnetic heads. This head block 10 is manufactured by forming a large number of magnetic heads arranged in matrix on a wafer according to thin-film technology, by cutting the wafer into bar shaped blocks so that each block has the aligned magnetic heads, and by grinding an Air Bearing Surface (ABS) of the head block 10 so as to adjust gap-depth of the heads. By this adjustment of the gap-depth, each of the heads will provide final output characteristics.

Figure 2:
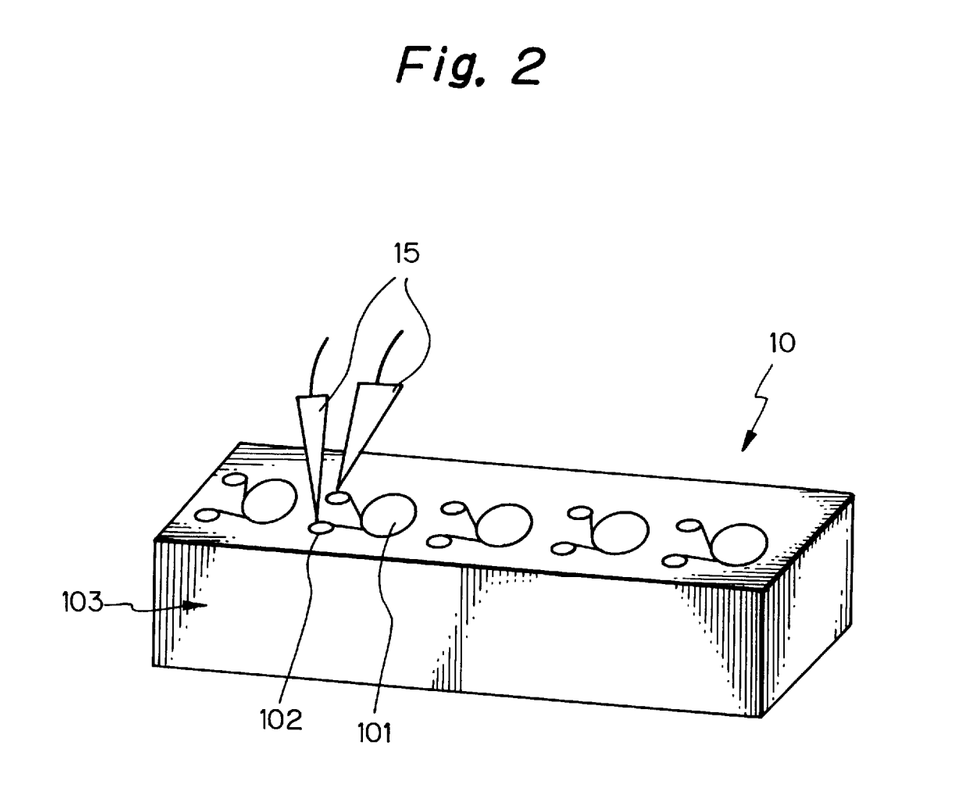
FIG. 2 is a view illustrating electrodes, of the tested magnetic head on a head block and probe pins of the test apparatus in the embodiment of FIG. 1.

In FIG. 2 which illustrates an example of the head block 10, reference numeral 101 denotes the magnetic head, 102 denotes input/output terminals of a MR transducer element in the tested magnetic head 101, and 103 denotes the ABS. The head block 10 has a plurality of aligned magnetic heads 101 which are not individually separated yet. Each of the magnetic heads 101 has the MR transducer element(s).

Probe pins 15 are fixed at a standstill position and the head block 10 is aligned with the probe pins 15. This alignment is performed by the X-Y-Z-θ table 12 driven by the X-Y-Z-θ controller 13 so that the probe pins 15 can electrically contact with the input/output terminals 102 of the MR transducer element of the desired magnetic head 101 formed on the head block 10, as illustrated in FIG. 2. The alignment of the input/output terminals 102 with respect to the probe pins 15 can be monitored by means of a CCD camera 17 which picks up image of this alignment portion via an optical system 16 such as an objective lens and by means of a TV monitor 18. The X-Y-Z-θ controller 13 is controlled by the control computer 14.

The probe pins 15 contacted to the input/output terminals 102 of the MR transducer element are electrically connected to a current source 19. This current source 19 provides a varying sense current with a wave shape corresponding to a voltage wave, such as a sine wave, which is supplied from an arbitrary wave shape generator 20 and is continuously and periodically varied with the lapse of time. The continuously and periodically varying sense current is provided to the MR transducer element via the probe pins 15. The probe pins 15 are also connected to an oscilloscope 22 and to the control computer 14 via a frequency filter (high pass frequency filter) 21. The frequency filter 21 passes only a relatively high frequency component (component with a frequency higher than its cut-off frequency) in the output voltage from the MR transducer element. Thus, a possible noise component which will have the relatively high frequency in the output voltage is input into the oscilloscope 22 for displaying the wave shape of the noise component and into the computer 14. In this case, a frequency of the voltage provided from the arbitrary wave shape generator 20, therefore a frequency of the current provided from the current source 19 should be determined to a value lower than the cut-off frequency of the frequency filter 21.

The X-Y-Z-θ controller 13 and the current source 19 are connected to the computer 14 and perform predetermined processes in response to commands from the computer 14.

Figure 3:
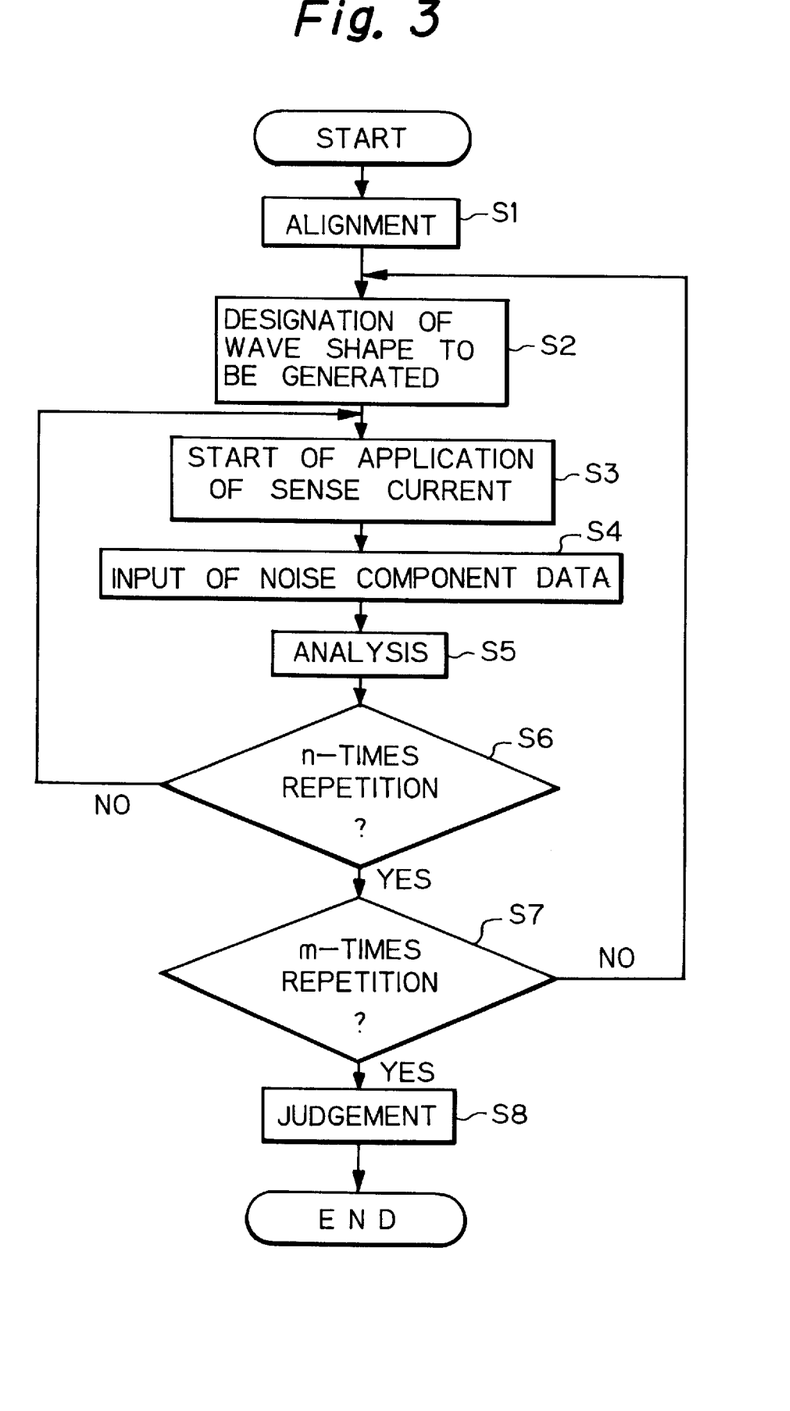
FIG. 3 is a flow chart schematically illustrating a part of control program of a computer shown in FIG. 1.

Referring to FIG. 3 which is a flowchart schematically illustrating a part of control program of the computer 14, the method of testing the magnetic head with the MR element will be described in detail.

First, at a step S1, alignment of the input/output terminals 102 of the MR transducer element of the magnetic head to be tested on the head block 10 which is fixed on the platform 11 of the X-Y-Z-θ table 12, with the probe pins 15, respectively, is executed. FIG. 2 illustrates a state wherein the probe pins 15 are contacting to the respective input/output terminals 102 by this alignment. This alignment will be performed by moving the X-Y-Z-θ table 12 in accordance with instruction to the X-Y-Z-θ controller 13 from the computer 14, using an well known alignment technique.

Then, at a step S2, the computer 14 designates a frequency and a wave shape of a continuously and smoothly varying sense current to be generated, to the arbitrary wave shape generator 20. Then, at a step S3, application of the continuously and smoothly varying sense current from the current source 19 is started. Thus, the continuously varying sense current with the designated frequency and wave shape such as a sine wave for example is applied to the MR transducer element in the magnetic head to be tested.

Due to the applied continuously varying sense current flowing through the MR transducer element, a continuously varying magnetic field is produced and applied to the MR transducer element itself causing its inner resistance to vary depending upon the variation of the magnetic field. As the voltage across the input/output terminals of the MR element is applied to the frequency filter 21, a low frequency component of the varying terminal voltage which is the product of the varying resistance of the MR element due to the applied varying sense current multiplied by this sense current is eliminated, and thus only a noise component, if occurred, with a relatively high frequency such as the Barkhausen noise will be applied to and displayed on the oscilloscope 22.

Figure 4A:
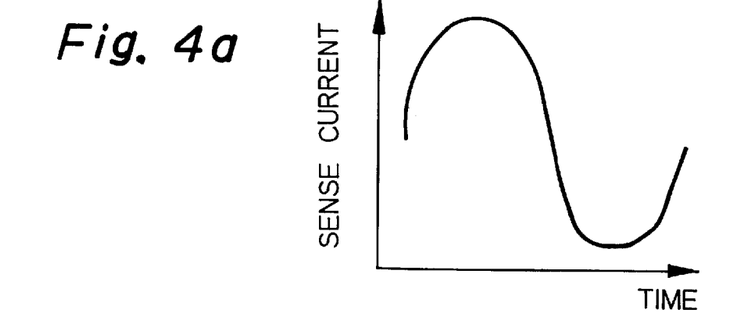
FIGS. 4a to 4c are graphs illustrating output voltage wave shape with respect to time of an arbitrary wave shape generator and head output voltage wave shape with respect to time the MR element.
Figure 4B:
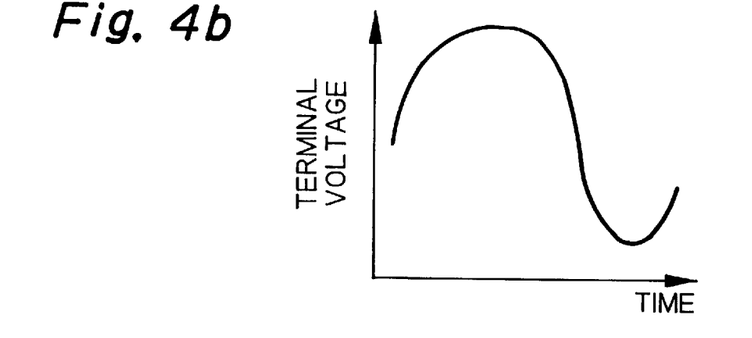
Figure 4C:
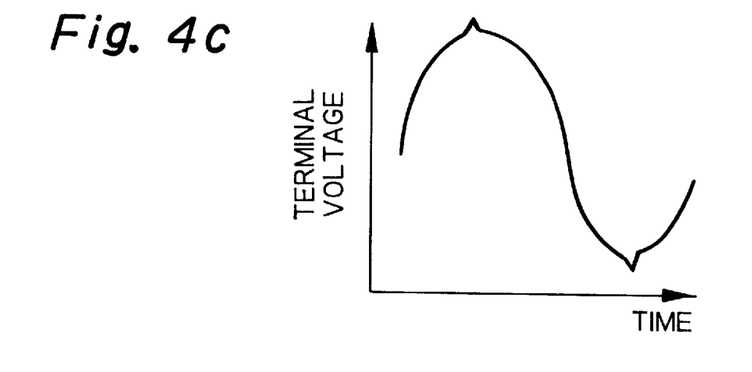

FIG. 4a shows a wave shape of the output voltage from the arbitrary wave shape generator 20, namely, of the output current from the current source 19. Since such the continuously and smoothly varying sense current is flowed through the MR transducer element, if the MR element is a good article with no production of Barkhausen noise, the voltage across the input/output terminals of the MR element (terminal voltage) will have a continuously and smoothly varying wave shape as shown in FIG. 4b. However, if the MR transducer element is producing Barkhausen noise, the voltage across the input/output terminals of the MR element (terminal voltage) will have a discontinuously varying wave shape with protruded noise components as shown in FIG. 4c. In this embodiment, only these protruded noise components are extracted by the frequency filter 21.

At a step S4, the filtered output voltage is input into the computer 14 and then A/D converted into digital input data. Then, at a step S5, the input data is analyzed. Namely, the computer 14 calculates, from the input data, continuity and inclination of wave shapes of the MR loop, and thus provides degree and magnitude of possible Barkhausen noise from this MR transducer element.

Thereafter, the input of the filtered voltage (step S4) and analysis (step S5) are necessarily repeated by n-times (n is an integer greater than 0) as indicated by a step S6. Furthermore, the application of the sense current (step S3), the input of the filtered voltage (step S4) and analysis (step S5) are necessarily repeated by m-times (m is an integer greater than 0) as indicated by a step S7.

Then, at a step S8, it is judged whether the tested magnetic head is a good article or not depending upon whether Barkhausen noise is produced or not.

According to the above-mentioned embodiment, the magnetic field applied to the MR transducer element is varied by continuously varying the sense current flowing through the MR transducer element, and then the varying voltage across the terminals of the MR transducer element based upon the resistance changes due to the applied varying sense current is detected whether a noise component is involved in the detected terminal voltage. Since the electromagnetic conversion characteristics of the MR transducer element is tested under the magnetic field produced by the sense current flowing through the MR transducer itself, any influence externally applied thereto can be almost eliminated resulting that reproducibility of the MR transducer element can be correctly evaluated. In addition, this test can be easily executed by applying a continuously varying sense current to a MR transducer element to be tested and by connecting the frequency filter with the input/output terminal of the MR transducer element.

Furthermore, according to this embodiment, the MR loop characteristics can be measured from magnetic heads aligned on and not yet individually separated from the head block 10 formed in a bar shape. Thus, it is unnecessary to practically operate the finished head assembly on the rotating disk, causing the testing procedure to extremely shorten. Also, from the MR loop characteristics, the computer 14 can easily obtain the magnitude of the output and also can quickly quantify Barkhausen noise which has been difficult to be quantified. In addition, according to this embodiment, the evaluation and selection of the magnetic head can be completed within a very short period of time.

Of course, it is possible to test the individually separated magnetic head in a similar manner. The sense current applied to the MR transducer element is not limited to a sine wave current, but any wave shape current as far as continuously varies. Also, it is not necessary to vary periodically.

Figure 5:
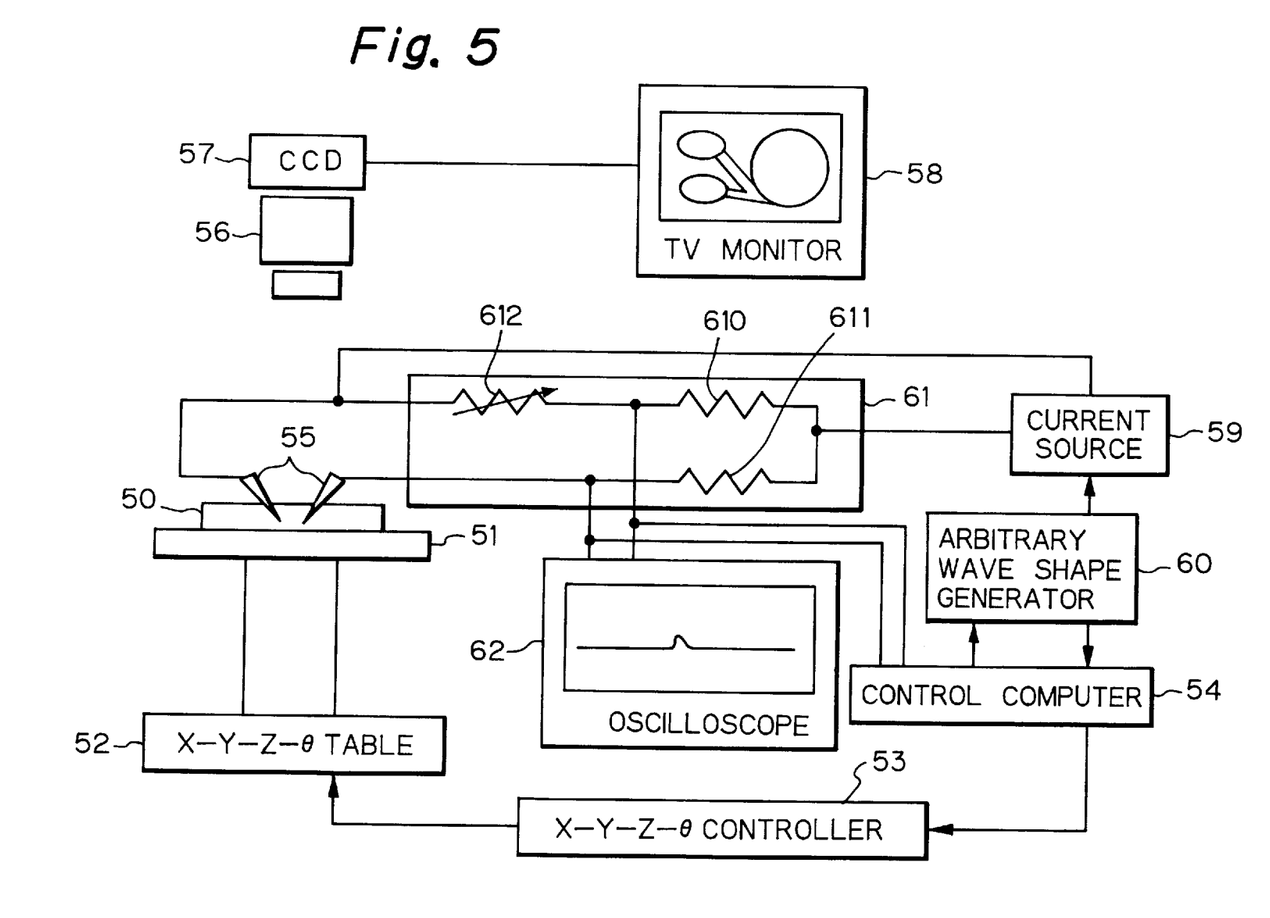
FIG. 5 is a block diagram schematically showing a circuit structure of an another embodiment of an apparatus for testing a magnetic head with at least one MR transducer element, according to the present invention.

FIG. 5 schematically shows a circuit structure of an another embodiment of an apparatus for testing a magnetic head with at least one thin film MR read element.

In the figure, reference numeral 50 denotes a head block with a plurality magnetic heads which have respective MR transducer elements to be tested, and 51 denotes a platform of a X-Y-Z-θ table 52. The head block 50 which is similar one as the head block 10 shown in FIG. 1, is temporally fixed on the platform 51. The X-Y-Z-θ table 52 for moving the platform 51 is electrically connected via a X-Y-Z-θ controller 53 to a control computer 54.

Probe pins 55 are fixed at a standstill position and the head block 50 is aligned with the probe pins 55. This alignment is performed by the X-Y-Z-θ table 52 driven by the X-Y-Z-θ controller 53 so that the probe pins 55 can electrically contact with the input/output terminals of the MR transducer element of the desired magnetic head formed on the head block 50. The alignment of the input/output terminals with respect to the probe pins 55 can be monitored by means of a CCD camera 57 which picks up image of this alignment portion via an optical system 56 such as an objective lens and by means of a TV monitor 58. The X-Y-Z-θ controller 53 is controlled by the control computer 54.

The probe pins 55 contacted to the input/output terminals of the MR transducer element are electrically connected to a current source 59. This current source 59 provides a varying sense current with a wave shape corresponding to a voltage wave, such as a sine wave, which is supplied from an arbitrary wave shape generator 60 and is continuously and periodically varied with the lapse of time. The continuously and periodically varying sense current is provided to the MR transducer element via the probe pins 55. The probe pins 55 are also connected to an oscilloscope 62 and to the control computer 54 via a bridge circuit 61.

The bridge circuit 61 has four arms constituted by two fixed resistors 610 and 611, one variable resistor 612 and the MR transducer element, input terminals connected to the current source 59, and output terminals connected to the oscilloscope 62 and t o the computer 54.

Thus, only varying voltage component corresponding to the varying resistance of the MR element due to the applied varying sense current is extracted from the varying voltage across the input/output terminals of the MR element, and is input into the oscilloscope 62 for displaying t he wave shape of the noise component and into the computer 54.

The X-Y-Z-θ controller 53 and the current source 59 are connected to the computer 54 and perform predetermined processes in response to commands from the computer 54.

Figure 6:
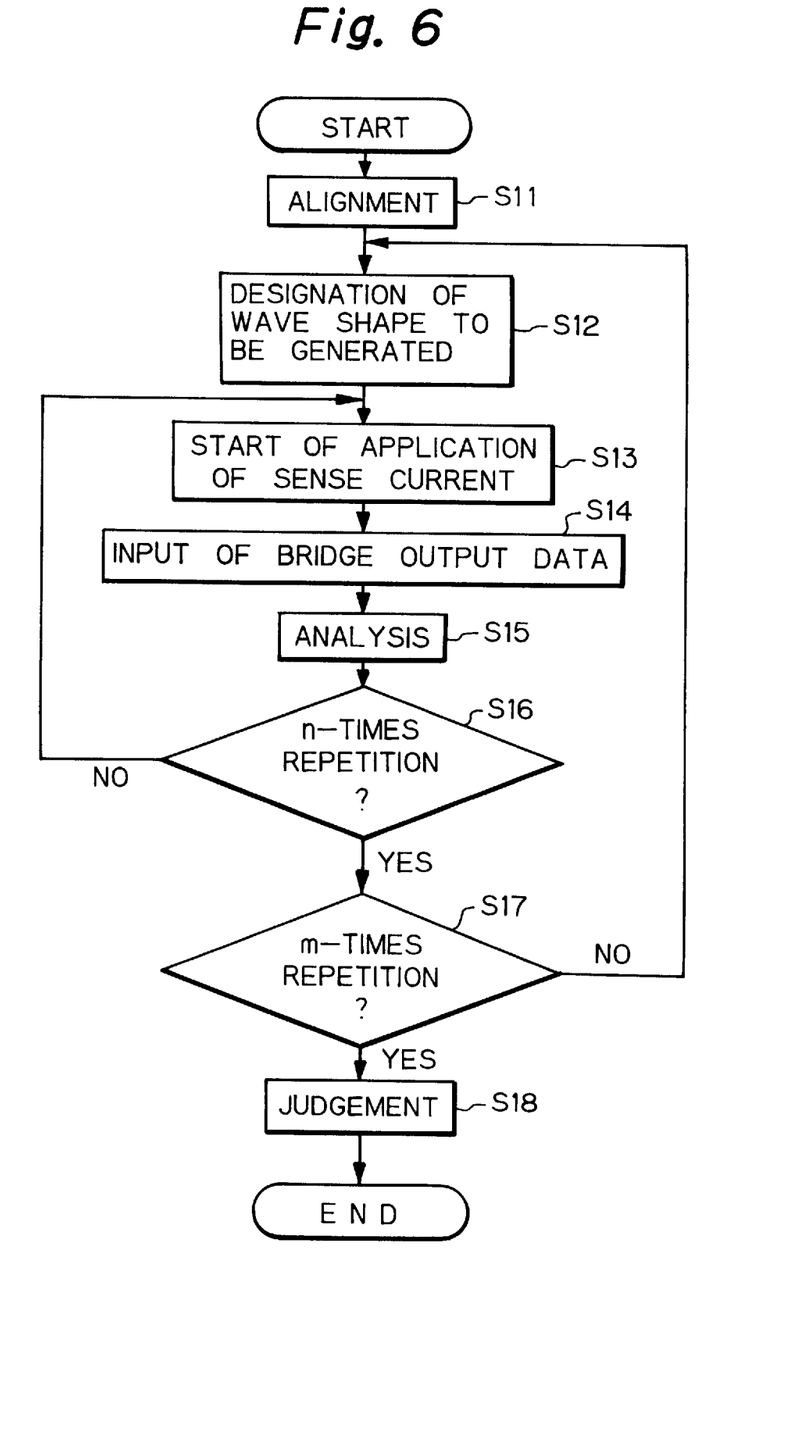
FIG. 6 is a flow chart schematically illustrating a part of control program of a computer shown in FIG. 5.

Referring t o FIG. 6 which is a flow char t schematically illustrating a part of control program of the computer 54, the method of testing the magnetic head with the MR element will be described in detail.

First, at a step S11, alignment of the input/output terminals of the MR transducer element of the magnetic head to be tested on the head block 50 which is fixed on the platform 51 of the X-Y-Z-θ table 52, with the probe pins 55, respectively, is executed. This alignment will be performed by moving the X-Y-Z-θ table 52 in accordance with instruction to the X-Y-Z-θ controller 53 from the computer 54, using an well known alignment technique.

Then, at a step S12, the computer 54 designates a frequency and a wave shape of a continuously and smoothly varying sense current to be generated, to the arbitrary wave shape generator 60. Then, at a step S13, application of the continuously and smoothly varying sense current from the current source 59 is started. Thus, the continuously varying sense current with the designated frequency and wave shape such as a sine wave for example is applied to the MR transducer element in the magnetic head to be tested.

Due to the applied continuously varying sense current flowing through the MR transducer element, a continuously varying magnetic field is produced and applied to the MR transducer element itself causing its inner resistance to vary depending upon the variation of the magnetic field. As the MR transducer element constitutes one arm of the bridge circuit 61, a possible noise component voltage can be extracted from the output terminal of the bridge circuit 61 when this bridge is balanced. This noise component voltage is applied to and displayed on the oscilloscope 62. It is necessary however to initialize the bridge circuit 61 into a balanced state by adjusting the variable resistor 612 under the application of a constant sense current to the MR transducer element so that the output voltage of the bridge 61 is set to zero.

As a result, a wave shape with noise components, if occurred, such as the Barkhausen noise will be displayed on the oscilloscope 62 as shown in FIG. 4c. It is possible to display only a noise component by simultaneously applying the output voltage from the arbitrary wave shape generator 60 to the oscilloscope 62 so as to cancel both the unnecessary wave shapes.

At a step S14, the output voltage from the bridge circuit 61 is input into the computer 54 and then A/D converted into digital input data. Then, at a step S15, the input data is analyzed. As for the input data for analyzing, data corresponding to the bridge output voltage when at least one period of the varying sense current is applied to the MR transducer element should be prepared. The computer 54 calculates, from these input data, continuity and inclination of wave shapes of the MR loop, and thus provides degree and magnitude of possible Barkhausen noise from this MR transducer element.

Thereafter, the input of the bridge output voltage (step S14) and analysis (step S15) are necessarily repeated by n-times (n is an integer greater than 0) as indicated by a step S16. Furthermore, the application of the sense current (step S13), the input of the bridge output voltage (step S14) and analysis (step S15) are necessarily repeated by m-times (m is an integer greater than 0) as indicated by a step S17.

Then, at a step S18, it is judged whether the tested magnetic head is a good article or not depending upon whether Barkhausen noise is produced or not.

According to the above-mentioned embodiment, the magnetic field applied to the MR transducer element is varied by continuously varying the sense current flowing through the MR transducer element, and then the varying voltage across the terminals of the MR transducer element based upon the resistance changes due to the applied varying sense current is detected whether a noise component is involved in the detected terminal voltage. Since the electromagnetic conversion characteristics of the MR transducer element is tested under the magnetic field produced by the sense current flowing through the MR transducer itself, any influence externally applied thereto can be almost eliminated resulting that reproducibility of the MR transducer element can be correctly evaluated. In addition, this test can be easily executed by applying a continuously varying sense current to a MR transducer element to be tested and by connecting the bridge circuit with the input/output terminal of the MR transducer element.

Furthermore, according to this embodiment, the MR loop characteristics can be measured from magnetic heads aligned on and not yet individually separated from-the head block 50 formed in a bar shape. Thus, it is unnecessary to practically operate the finished head assembly on the rotating disk, causing the testing procedure to extremely shorten. Also, from the MR loop characteristics, the computer 54 can easily obtain the magnitude of the output and also can quickly quantify Barkhausen noise which has been difficult to be quantified. In addition, according to this embodiment, the evaluation and selection of the magnetic head can be completed within a very short period of time.

Of course, it is possible to test the individually separated magnetic head in a similar manner. The sense current applied to the MR transducer element is not limited to a sine wave current, but any wave shape current as far as continuously varies. Also, it is not necessary to vary periodically.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for testing a magnetic head provided with at least one magnetoresistive transducer element and input/output terminals of said magnetoresistive transducer element during manufacture utilizing an internal magnetic field, said method comprising the steps of:

applying, through a single pair of conductors, a sense current sinusoidally varying with respect to time to said magnetoresistive transducer element via said input/output terminals without applying an external magnetic field to said magnetoresistive transducer element;

receiving, through said single pair of conductors, a terminal voltage across said input/output terminals of said magnetoresistive transducer element;

measuring said terminal voltage across said input/output terminals of said magnetoresistive transducer element to check magneto-resistance characteristics of said magnetoresistive transducer element; and comparing the magneto-resistance characteristics against an acceptable value, wherein said value denotes a usable magnetoresistive transducer.

2. The method as claimed in claim 1, wherein said sense current applying step includes a step of applying a continuously varying sense current to said magnetoresistive transducer element via said input/output terminals, and wherein said measuring step includes a step of extracting a high frequency component of the measured terminal voltage.

3. The method as claimed in claim 1, wherein said sense current applying step includes a step of applying a continuously varying sense current to said magnetoresistive transducer element, and wherein said measuring step includes a step of extracting only a component of the measured terminal voltage by means of a bridge circuit, said component corresponding to the varying resistance of said magnetoresistive transducer element due to the applied varying sense current.

4. A method for testing a plurality of magnetic heads provided with at least one magnetoresistive transducer element and input/output terminals of said magnetoresistive transducer element during manufacture utilizing the internal magnetic field, said method comprising the steps of:

applying, through a single pair of conductors, a sense current sinusoidally varying with respect to time to said magnetoresistive transducer element via said input/output terminals without applying an external magnetic field to said magnetoresistive transducer element, said magnetoresistive transducer element being one of the magnetoresistive transducer elements of said plurality of magnetic heads, wherein said heads, are aligned on a head block and not yet individually separated from the head block;

receiving, through said single pair of conductors, a terminal voltage across said input/output terminals of said magnetoresistive transducer element;

measuring said terminal voltage across said input/output terminals of said magnetoresistive transducer element to check magneto-resistance characteristics of said magnetoresistive transducer element;

comparing the magneto-resistance characteristics against an acceptable value, wherein said value denotes a usable magnetoresistive transducer, said method steps are repeated for each said magnetoresistive transducer element on each said magnetic head located on said head block.

5. The method as claimed in claim 4, wherein said sense current applying step includes a step of applying a continuously varying sense current to said magnetoresistive transducer element via said input/output terminals, and wherein said measuring step includes a step of extracting a high frequency component of the measured terminal voltage.

6. The method as claimed in claim 4, wherein said sense current applying step includes a step of applying a continuously varying sense current to said magnetoresistive transducer element, and wherein said measuring step includes a step of extracting only a component of the measured terminal voltage by means of a bridge circuit, said component corresponding to the varying resistance of said magnetoresistive transducer element due to the applied varying sense current.

7. An apparatus for testing a magnetic head provided with at least one magnetoresistive transducer element and input/output terminals of said magnetoresistive transducer element during manufacture utilizing an internal magnetic field, said apparatus comprising:

a probe means for electrically contacting to said input/output terminals of said magnetoresistive transducer element, wherein said probe means consists of a single pair of conductors;

a current generation means for providing a sense current sinusoidally varying with respect to time;

means for applying the provided varying sense current to said magnetoresistive transducer element via said probe means without applying an external magnetic field to said magnetoresistive transducer element;

means for receiving, through said single pair of conductors, a terminal voltage across said input/output terminals of said magnetoresistive transducer element;

means for measuring said terminal voltage across said input/output terminals of said magnetoresistive transducer element via said probe means to check magneto-resistance characteristics of said magnetoresistive transducer element; and means for comparing the magneto-resistance characteristics against an acceptable value, wherein said value denotes a usable magnetoresistive transducer.

8. The apparatus as claimed in claim 7, wherein said current generation means includes means for providing a continuously varying sense current with respect to time, and wherein said measuring means includes means for extracting a high frequency component of the measured terminal voltage across said input/output terminals.

9. The apparatus as claimed in claim 8, wherein said extracting means is a high pass frequency filter.

10. The apparatus as claimed in claim 7, wherein said current generation means includes means for providing a continuously varying sense current with respect to time, and wherein said measuring means includes means for extracting only a component of the measured terminal voltage, said component corresponding to the varying resistance of said magnetoresistive transducer element due to the applied varying sense current.

11. The apparatus as claimed in claim 10, wherein said extracting means includes a bridge circuit with four arms, said input/output terminals of said magnetoresistive transducer element being connected to said bridge circuit as one of said arms via said probe means so that only a component corresponding to the varying resistance of said magnetoresistive transducer element due to the applied varying sense current is extracted.

12. An apparatus for testing a plurality of magnetic heads provided with at least one magnetoresistive transducer element and input/output terminals of said magnetoresistive transducer element during manufacture utilizing an internal magnetic field, said apparatus comprising:

a probe means for electrically contacting to said input/output terminals of said magnetoresistive transducer element of each of said magnetic heads which are aligned on a head block and are not yet individually separated from the head block;

a current generation means for providing a sense current sinusoidally varying with respect to time;

means for applying the provided varying sense current to said magnetoresistive transducer element via said probe means without applying an external magnetic field to said magnetoresistive transducer element;

means for receiving, through said single pair of conductors, a terminal voltage across said input/output terminals of said magnetoresistive transducer element;

means for measuring said terminal voltage across said input/output terminals of said magnetoresistive transducer element via said probe means to check magneto-resistance characteristics of said magnetoresistive transducer element; and means for comparing the magneto-resistance characteristics against an acceptable value, wherein said value denotes a usable magnetoresistive transducer.

13. The apparatus as claimed in claim 12, wherein said current generation means includes means for providing a continuously varying sense current with respect to time, and wherein said measuring means includes means for extracting a high frequency component of the measured terminal voltage across said input/output terminals.

14. The apparatus as claimed in claim 13, wherein said extracting means is a high pass frequency filter.

15. The apparatus as claimed in claim 12, wherein said current generation means includes means for providing a continuously varying sense current with respect to time, and wherein said measuring means includes means for extracting only a component of the measured terminal voltage, said component corresponding to the varying resistance of said magnetoresistive transducer element due to the applied varying sense current.

16. The apparatus as claimed in claim 15, wherein said extracting means includes a bridge circuit with four arms, said input/output terminals of said magnetoresistive transducer element being connected to said bridge circuit as one of said arms via said probe means so that only a component corresponding to the varying resistance of said magnetoresistive transducer element due to the applied varying sense current is extracted.

* * * * *